United States Patent
Lee et al.

(10) Patent No.: US 12,166,066 B2
(45) Date of Patent: Dec. 10, 2024

(54) THIN FILM LAMINATE STRUCTURE, INTEGRATED DEVICE INCLUDING THE SAME, AND METHOD OF MANUFACTURING THE THIN FILM LAMINATE STRUCTURE

(71) Applicants: Samsung Electronics Co., Ltd., Suwon-si (KR); SEOUL NATIONAL UNIVERSITY R & DB FOUNDATION, Seoul (KR)

(72) Inventors: Kiyoung Lee, Seoul (KR); Kookrin Char, Seoul (KR); Byunghoon Na, Suwon-si (KR); Hahoon Lee, Yongin-si (KR); Dowon Song, Seoul (KR)

(73) Assignees: Samsung Electronics Co., Ltd., Gyeonggi-do (KR); Seoul National University R&DB Foundation, Seoul (KR)

(*) Notice: Subject to any disclaimer, the term of this patent is extended or adjusted under 35 U.S.C. 154(b) by 539 days.

(21) Appl. No.: 17/370,361

(22) Filed: Jul. 8, 2021

(65) Prior Publication Data
US 2022/0238633 A1    Jul. 28, 2022

(30) Foreign Application Priority Data
Jan. 26, 2021    (KR) .................. 10-2021-0011036

(51) Int. Cl.
*H01G 4/12*    (2006.01)
*H01G 4/30*    (2006.01)
*H01L 49/02*   (2006.01)

(52) U.S. Cl.
CPC .............. *H01L 28/56* (2013.01); *H01L 28/60* (2013.01); *H01G 4/1227* (2013.01); *H01G 4/30* (2013.01)

(58) Field of Classification Search
None
See application file for complete search history.

(56) References Cited

U.S. PATENT DOCUMENTS 5,638,251 A * 6/1997 Goel ............... H01G 4/08
                                           427/249.7
6,911,402 B2   6/2005 Lee et al.
(Continued)

FOREIGN PATENT DOCUMENTS

CN    101542657 A    9/2009
JP    1997-252091 A  9/1997
(Continued)

OTHER PUBLICATIONS

On the Importance of the Work Function and Electron Carrier Density of OxideElectrodes for the Functional Properties of Ferroelectric Capacitors; Jun Wang et al Phys. Status Solidi RRL 2020 (Year: 2020).*

*Primary Examiner* — Humera N. Sheikh
*Assistant Examiner* — Elizabeth D Ivey
(74) *Attorney, Agent, or Firm* — Harness, Dickey & Pierce, P.L.C.

(57) ABSTRACT

A thin film laminate structure, an integrated device including the same, and a method of manufacturing the thin film laminate structure are provided. The thin film laminate structure includes two or more dielectric layers, wherein at least one of the dielectric layers of the thin film laminate structure includes a compound represented by Formula 1 and having a perovskite-type crystal structure having a B/B' composition ratio different from that of a remainder of the dielectric layers:

$AB_{1-x}B'_xO_3$    <Formula 1> wherein, in Formula 1, A, B, B', and x are the same as defined in the specification.

29 Claims, 9 Drawing Sheets

(56) References Cited

U.S. PATENT DOCUMENTS

| | | |
|---|---|---|
| 7,029,971 B2 | 4/2006 | Borland et al. |
| 10,600,572 B2 | 3/2020 | Kim et al. |
| 2008/0118731 A1 | 5/2008 | Srinivasan et al. |
| 2019/0318774 A1* | 10/2019 | Kittl .................... G11C 11/2259 |
| 2020/0411240 A1* | 12/2020 | Ham .................... H01G 4/1227 |

FOREIGN PATENT DOCUMENTS

| | | |
|---|---|---|
| JP | 2018-014498 A | 1/2018 |
| KR | 10-0468852 B1 | 1/2005 |
| KR | 10-2018-0051760 A | 5/2018 |

* cited by examiner

THIN FILM LAMINATE STRUCTURE, INTEGRATED DEVICE INCLUDING THE SAME, AND METHOD OF MANUFACTURING THE THIN FILM LAMINATE STRUCTURE

CROSS-REFERENCE TO RELATED APPLICATION

This application is based on and claims priority under 35 U.S.C. § 119 to Korean Patent Application No. 10-2021-0011036, filed on Jan. 26, 2021, in the Korean Intellectual Property Office, the disclosure of which is incorporated by reference herein in its entirety.

BACKGROUND

1. Field

The present disclosure relates to a thin film laminate structure, an integrated device including the same, and a method of manufacturing the thin film laminate structure.

2. Description of the Related Art

Recently, in accordance with electronic devices miniaturized and highly functionalized, there is demand for electronic devices adopted by various electronic circuits to be miniaturized and highly functionalized. These electronic circuits include a number of metal insulator metal (MIM) capacitors, metal oxide semiconductor (MOS) transistors, or the like. To implement miniaturization, high-capacity, and high-performance of these electronic devices, there is needed a composite dielectric film which exhibits a high dielectric constant and a low leakage current characteristic even with a thin thickness.

SUMMARY

Provided is a thin film laminate structure that implements an improved dielectric constant or/and improved leakage current.

Provided is an integrated device including the thin film laminate structure.

Provided is a method of manufacturing the thin film laminate structure.

Additional aspects will be set forth in part in the description which follows and, in part, will be apparent from the description, or may be learned by practice of the presented embodiments of the disclosure.

According to an aspect, provided is a thin film laminate structure including a dielectric structure including two or more dielectric layers, wherein one of the dielectric layers of the thin film laminate structure includes a compound having a perovskite-type crystal structure and represented by Formula 1 having a B/B' composition ratio different from that of the other ones:

$$AB_{1-x}B'_xO_3 \qquad \text{<Formula 1>}$$

wherein, in Formula 1, A may be a divalent (+2) cation, B and B' may each independently be a tetravalent (+4) cation, and $0 \leq x < 1$.

O—B—O chemical bonds and O—B'—O chemical bonds in the perovskite-type crystal structure have different bond strengths, and the B/B' composition ratio of the compound may affect permittivities of the at least one dielectric layer.

The at least one dielectric layer may have increased permittivity at 0° C. to 120° C. due to an increase in a ferroelectric-to-paraelectric transition temperature in the perovskite-type crystal structure based on the B/B' composition ratio.

The compound represented by Formula 1 may include at least one of $BaTi_{1-z}Hf_zO_3$, $BaTi_{1-z}Zr_zO_3$, $SrTi_{1-z}Hf_zO_3$, $SrTi_{1-z}Zr_zO_3$, $CaTi_{1-z}Hf_zO_3$, or $CaTi_{1-z}Zr_zO_3$, wherein z satisfies that $0 < z < 1$.

The at least one dielectric layer may include a compound represented by Formula 2:

$$A_{1-y}A'_yB_{1-x}B'_xO_3 \qquad \text{<Formula 2>}$$

wherein, in Formula 2, A and A' may each independently be a divalent (+2) cation, B and B' may each independently be a tetravalent (+4) cation, $0 < x < 1$, and $0 < y < 1$.

The compound may include a compound selected from $Ba_{1-w}Ca_wTi_{1-z}Hf_zO_3$, $Ba_{1-w}Sr_wTi_{1-z}Hf_zO_3$, $Ba_{1-w}Ca_wTi_{1-z}Zr_zO_3$, $Ba_{1-w}Sr_wTi_{1-z}Zr_zO_3$, $Sr_{1-w}Ca_wTi_{1-z}Hf_zO_3$, or $Sr_{1-w}Ca_wTi_{1-z}Zr_zO_3$, wherein z may satisfy that $0 < z < 1$, and w may satisfy that $0 < w < 1$.

The thin film laminate structure may include a first electrode layer including a conductive compound having a perovskite-type crystal structure, wherein the dielectric structure is on the first electrode layer.

The conductive compound may be a transparent conductive oxide.

The conductive compound may include $La_{x'}Ba_{1-x'}SnO_3$ wherein $0 < x' < 1$.

For example, $0 < x' \leq 0.07$.

The first electrode layer may have metallic or semiconductive properties.

The dielectric structure may include: a first dielectric layer including a compound represented by Formula 1, wherein $x=0$; and a second dielectric layer and a third dielectric layer on both surfaces of the first dielectric layer, wherein at least one of the second dielectric layer and the third dielectric layer may each independently include a compound represented by Formula 1, wherein $0 < x < 1$.

The first dielectric layer may include at least one of $BaTiO_3$, $SrTiO_3$, $CaTiO_3$, $BaHfO_3$, $BaZrO_3$, $SrHfO_3$, $SrZrO_3$, $CaHfO_3$, or $CaZrO_3$.

The second dielectric layer and the third dielectric layer may each independently include at least one of $BaTi_{1-z}Hf_zO_3$, $BaTi_{1-z}Zr_zO_3$, $SrTi_{1-z}Hf_zO_3$, $SrTi_{1-z}Zr_zO_3$, $CaTi_{1-z}Hf_zO_3$, or $CaTi_{1-z}Zr_zO_3$, wherein z may satisfy that $0 < z < 1$.

The second dielectric layer and the third dielectric layer may have a thickness of 10% or less of a total thickness of the dielectric structure.

The thin film laminate structure may include: a fourth dielectric layer; and a fifth dielectric layer and a sixth dielectric layer arranged on both surfaces of the fourth dielectric layer, wherein the fourth dielectric layer, the fifth dielectric layer, and the sixth dielectric layer may each independently include a compound represented by Formula 1, wherein $0 < x < 1$, and a concentration of B cation of the compound in the fourth dielectric layer may be higher than those in the fifth dielectric layer and the sixth dielectric layer.

In the compound represented by Formula 1 of the fourth electric layer, x may be less than 0.6. The compound may include at least one of $BaTi_{1-z}Hf_zO_3$, $BaTi_{1-z}Zr_zO_3$, $SrTi_{1-z}Hf_zO_3$, $SrTi_{1-z}Zr_zO_3$, $CaTi_{1-z}Hf_zO_3$, or $CaTi_{1-z}Zr_zO_3$, wherein z may satisfy $0 < z < 1$.

The fifth dielectric layer and the sixth dielectric layer may have a thickness of 10% or less of a total thickness of the dielectric structure.

According to another aspect, provided is an integrated device including:

a first electrode layer; a second electrode layer, and the above-described thin film laminate structure between the first electrode layer and the second electrode layer.

The second electrode layer may include the same or different conductive compound as the conductive compound of the first electrode layer.

The second electrode layer may include $La_{x'}Ba_{1-x'}SnO_3$ (wherein 0<x'<1).

A Ba/La composition ratio of the second electrode layer may be the same or different from that of the first electrode layer, for example a lower electrode layer.

The integrated device may be a memory device or a logic device.

The integrated device may include a capacitor or a transistor.

According to another aspect, provided is a method of manufacturing a thin film laminate structure, including:

preparing a substrate; and forming, on the substrate, the above-described thin film laminate structure.

The forming of the thin film laminate structure may use physical vapor deposition (PVD), chemical vapor deposition (CVD), molecular beam epitaxy (MBE), atomic layer deposition (ALD), or pulsed laser deposition (PLD).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
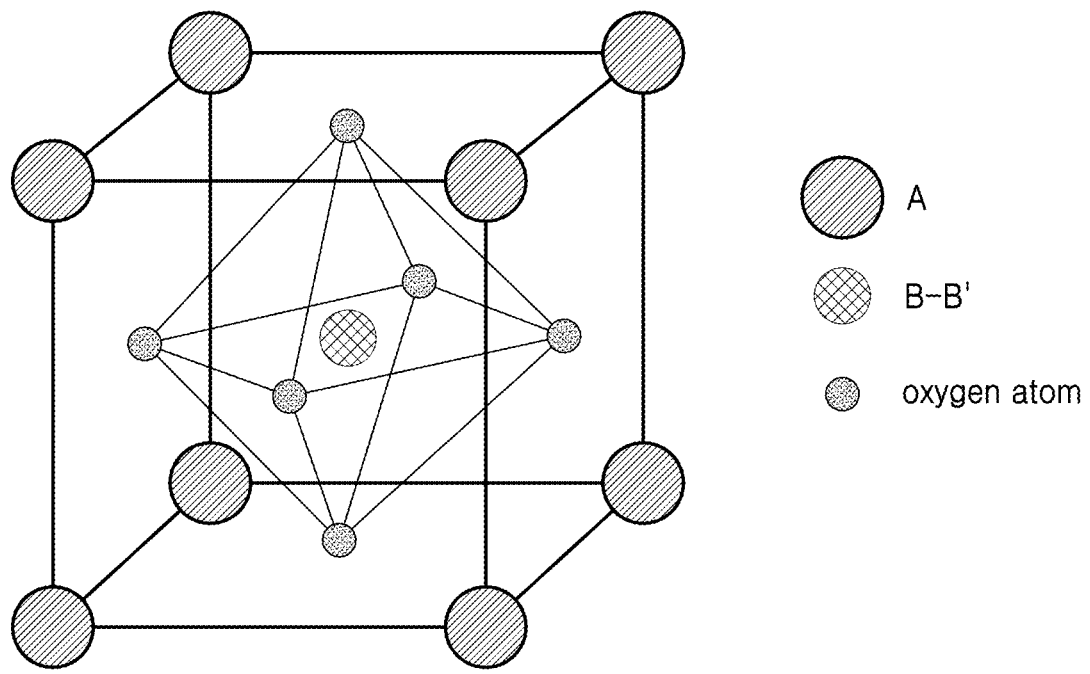
FIG. 1 is a schematic view showing a perovskite-type crystal structure of a dielectric layer compound included in a thin film laminate structure according to some embodiments.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of a thin film laminate structure according to the present invention, an integrated device including the same, and a method of manufacturing the thin film laminate structure will be described in greater detail. Accordingly, it should be apparent to those skilled in the art that the following description of various embodiments of the present disclosure is provided for illustration purpose only and not for the purpose of limiting the present disclosure as defined by the appended claims and their equivalents.

Hereinafter, it will also be understood that when an element is referred to as being "on" or "above" another element, it can be "directly on and in contact" with the other element, or "in non-contact" with intervening elements thereon.

As used herein, the singular forms "a," "an," and "the" are intended to include the plural forms as well, unless the context clearly indicates otherwise. When a portion is referred to as "comprising" and/or "including" an element, it means that, unless stated specifically otherwise, another element can further be included; rather than excluded.

As used herein, the term "combination" includes a mixture, an alloy, a reaction product, and/or the like unless otherwise stated.

Although the terms "first," "second," "third," "fourth," "fifth," "sixth," etc., may be used herein to describe various elements and/or components, these elements and/or components should not be limited by these terms. These terms are used only to distinguish one component from another, not for purposes of limitation.

The term "or" refers to "and/or" unless otherwise stated. As used herein, the terms "an embodiment," "embodiments," and the like indicate that elements described with regard to an embodiment are included in at least one embodiment described in this specification and may or may not present in other embodiments. In addition, it may be understood that the described elements are combined in any suitable manner in various embodiments. Unless otherwise defined, technical and scientific terms used herein have the same meaning as commonly understood by one or ordinary skill in the art to which this application belongs. All patents, patent applications, and other cited references are incorporated herein by reference in their entirety. However, in the event of any conflict or inconsistency between terms used herein and terms of the cited references, the terms used in this specification take precedence over the terms of the cited references. While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modification, variations, improvements, and substantial equivalents.

When an electric field is applied to a dielectric material or a dielectric, a dielectric polarization phenomenon occurs in which polarized molecules are aligned. The degree of polarization is proportional to the electric field. The degree to which the degree of dielectric polarization is proportional to the applied electric field may be expressed as a dielectric constant. Usually, a permittivity (c) of a dielectric material and/or a dielectric may be expressed as a relative permittivity (Er), which represents a ratio of the permittivity (c) to the permittivity (Co) of vacuum, and may also be referred to as a dielectric constant. The term "permittivity" as used herein does not deal with an absolute number, and the above expressions may be used interchangeably.

Generally, depending on the molecular structure of the dielectric material and/or the dielectric, the proportional degree of dielectric polarization may be different according to the direction of the applied electric field. A dielectric layer according to some embodiments has a crystal structure, and thus, the permittivity in the crystal axis (c-axis) direction may be different from the permittivity of a plane (in-plane or x-y plane) perpendicular thereto.

In embodiments, a permittivity of interest is the permittivity in the perpendicular direction. This is because in an electronic device to which a thin film laminate structure is applied, the electric field is applied in a vertical direction, and the behavior of the dielectric layer thereby becomes a major performance factor.

A compound having a perovskite-type crystal structure and represented by $ABO_3$, may have a tetrahedral, octahedral, or cubic crystal, and may be formed by the chemical bonding of two kinds of cations (e.g., represented by A and B) and an oxygen (O) anion. The compound having a perovskite-type crystal structure may exhibit a high permittivity.

A dielectric layer including the compound having a perovskite-type crystal structure is applicable to capacitors (metal-insulator-metal, MIM) for DRAMs, which require a very high permittivity, as well as in memory devices. For application in capacitors or memory devices, a higher crystallinity is required for the compound having a perovskite-type crystal structure. From the higher crystallinity, along with designing to a perovskite-type crystal structure-based composite dielectric film that maintains a maximum (or otherwise high) (001) crystal orientation in the vertical direction, leakage current may also be improved.

The thin film laminate structure according to an embodiment may be a thin film laminate structure including two or more dielectric layers, wherein one of the dielectric layers of the thin film laminate structure may include a compound having a perovskite-type crystal structure and represented by Formula 1, wherein a B/B' composition ratio is different from that of the other dielectric layers:

  <Formula 1> wherein, in Formula 1, A may be a divalent (+2) cation, B and B' may each independently be a tetravalent (+4) cation, and $0 \le x < 1$.

In the compound of Formula 1, the units of x may be based on atomic %.

In the dielectric layer compound the different O—B—O chemical bond and O—B'—O chemical bond may strengthen the perovskite-type crystal structure. For example, in an example where A is Ba, B is Ti, and B' is Hf, a $BaTiO_3$ compound having a perovskite-type crystal structure may be ferroelectric even at room temperature, and a $BaHfO_3$ compound having the same crystal structure may be paraelectric at a specific phonic frequency of an electric field. This is due to relatively higher bond strength of the Hf—O chemical bond compared to the Ti—O chemical bond.

FIG. 1 is a schematic view showing a perovskite-type crystal structure of a dielectric layer compound included in a thin film laminate structure according to some embodiments.

The dielectric layer compound in a thin film laminate structure according to some embodiment, as shown in FIG. 1, shows that B cations may form an alloy with B' cations in the perovskite-type crystal structure. Through this alloy formation, the crystallinity of the dielectric layer compound may be controlled through the O—B—O chemical bond and the O—B'—O chemical bond strengths.

In the dielectric layer compound included in the thin film laminate structure according to some embodiments, the permittivities of the dielectric layers may also be controlled by controlling the B/B' composition ratio, which exhibits different O—B—O chemical bond and O—B'—O chemical bond strengths in the perovskite-type crystal structure.

By controlling the B/B' composition ratio in the perovskite-type crystal structure so that a ferroelectric-to-paraelectric transition temperature is increased, the permittivity of the dielectric layer may also be increased for a temperature range (e.g., at 0° C. to 120° C.).

Therefore, the dielectric layer may be ferroelectric or paraelectric depending on the B/B' composition ratio.

In some embodiments, A may be at least one of Ba, Sr, or Ca; B may be at least one of Ti or Zr; or B' may be at least one Zr, Hf, or Rf. B' may be selected to have a higher electronegativity than B or form a stronger bond with O. For example, the compound may include a compound selected from among $BaTi_{1-z}Hf_zO_3$, $BaTi_{1-z}Zr_zO_3$, $SrTi_{1-z}Hf_zO_3$, $SrTi_{1-z}Zr_zO_3$, $CaTi_{1-z}Hf_zO_3$, or $CaTi_{1-z}Zr_zO_3$, wherein z may satisfy $0 < z < 1$. For example, a second dielectric layer 2 and a third dielectric layer 3 may include a compound selected from among $BaTi_{1-z}Hf_zO_3$, $BaTi_{1-z}Zr_zO_3$, or $SrTi_{1-z}Hf_zO_3$, for example, $BaTi_{1-z}Hf_zO_3$. For example, z may satisfy that $0 < z \le 0.9$, or $0 < z \le 0.8$, or $0 < z \le 0.7$, or $0 < z \le 0.6$.

The dielectric layer may further include a compound represented by Formula 2:

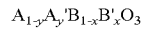  <Formula 2> wherein, in Formula 2, A and A' may each independently be a divalent (+2) cation, B and B' may each independently be a tetravalent (+4) cation, and $0 < x < 1$, and $0 < y < 1$.

In the compound represented by Formula 2, the units of x and y may be based on atomic %.

For example, the compound may be partially substitutional doped with A'. In some embodiments, the dielectric layer may include a compound selected from $Ba_{1-w}Ca_wTi_{1-z}Hf_zO_3$, $Ba_{1-w}Sr_wTi_{1-z}Hf_zO_3$, $Ba_{1-w}Ca_wTi_{1-z}Zr_zO_3$, $Ba_{1-w}Sr_wTi_{1-z}Zr_zO_3$, $Sr_{1-w}Ca_wTi_{1-z}Hf_zO_3$, or $Sr_{1-w}Ca_wTi_{1-z}Zr_zO_3$, wherein z may satisfy that $0 < z < 1$, and w may satisfy that $0 < w < 1$. The units of z and w may be based on atomic %.

Through partial substitutional doping of A element with A' element, in addition to B element with B' element, in the compound represented by Formula 2, tensile strain is induced to the dielectric layer, so that the dielectric layer may change from paraelectric to ferroelectric or may have an increased dielectric constant. In comparison, in the case of only partial substitutional doping of only A element with A' element in the compound of the dielectric layer, due to the characteristics of A site associated with the crystal size, strain in crystal structure may be induced, but this may not be effective in terms of permittivity improvement and leakage current improvement.

The thin film laminate structure may be formed on or include a first electrode layer comprising a conductive compound having a perovskite-type crystal structure.

In some examples, when a metal material such as Ru, Ir, Pt, Au, or the like is used, instead of the conductive compound of a perovskite-type crystal structure, in the first electrode layer, due to high oxidation and reduction reactivity of the noble metal itself, a different lattice structure other than the perovskite-type crystal structure may be easily formed in the first electrode layer, for example in the lower electrode layer. Even when a perovskite-type crystal structure is formed in the first electrode layer, the perovskite crystal structure may easily collapse if external environments such as vacuum, high temperature, or oxygen partial pressure are changed. Due to this, in the above-described thin film laminate structure formed on the first electrode layer, the crystallinity in the interface layer between the first electrode layer and the thin film laminate structure and the crystallinity of the thin film laminate structure may degrade, and the permittivity may be reduced.

In some embodiments, the conductive compound may be a transparent conductive oxide.

The conductive compound may include, for example, $La_{x'}Ba_{1-x'}SnO_3$ (wherein $0<x'<1$). The conductive compound may have a high electron mobility and thus may be applied, for example, to an embodiment of a dielectric layer (e.g. as described above) acting as dielectric gate dielectric, and, thus, may be included in electronic devices such as a high-speed switch, a field effect transistor (FET), or the like.

In some embodiments, x' may satisfy that $0<x'\leq 0.07$. For example, x' may satisfy that $0<x'\leq 0.06$, or $0<x'\leq 0.05$, or $0<x'\leq 0.04$. When x' is within these ranges, the first electrode layer may form lattice matching with the thin film laminate structure, and thus, has an improved leakage current and a high permittivity. Similarly, due to the similarities in crystal structure, the first electrode layer may act as a seed layer during the forming of the dielectric layer including the perovskite-type crystal structure. In some embodiments, the interface between the dielectric layer and the first electrode layer may have a discernable interface between the dielectric layer and the first electrode layer in, for example, an TEM image, however due to the similarities in crystal structure, in some embodiments, the interface may be unclear or not discernable.

The first electrode layer may exhibit metallic or semiconductive properties depending on a Ba/La composition ratio.

The first electrode layer may be arranged on a structure where a substrate and a buffer layer are sequentially arranged. The buffer layer may include a conductive compound having a perovskite-type crystal structure. For example, the substrate may be $SrTiO_3$. For example, the buffer layer may be $BaTiO_3$, $(Sr, Ba)TiO_3$, or a combination thereof. (Ba, Sr) means $Ba_jSr_k$ (wherein $j+k=1$, $0\leq j$, $k\leq 1$). The paraelectric property of the substrate (e.g., $SrTiO_3$) may be changed to a ferroelectric property by tension. The first lower electrode layer, for example the lower electrode layer may have improved electron mobility due to the insertion of the buffer layer.

Figure 2:
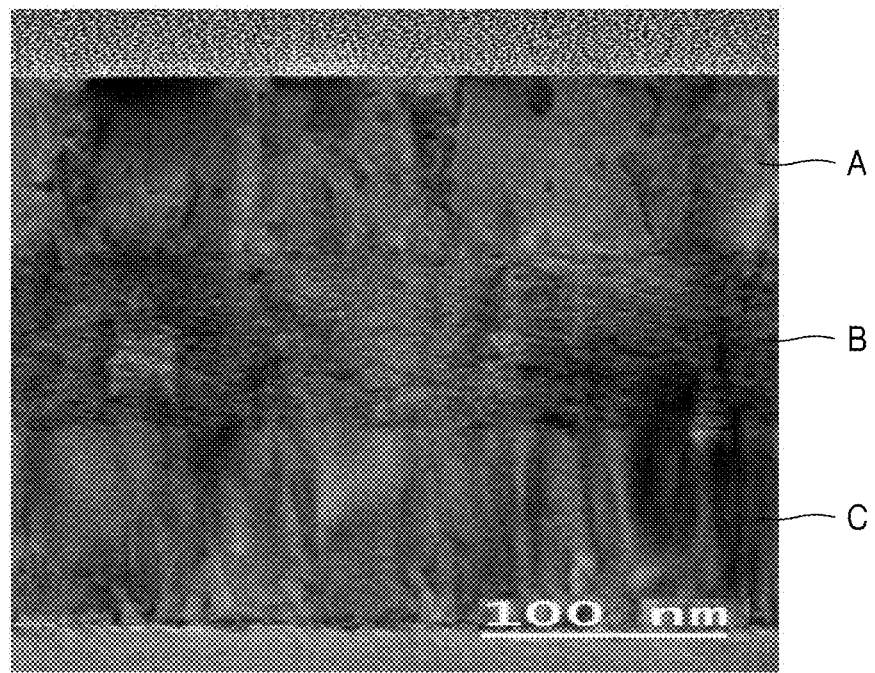
FIG. 2 is a transmission electron microscope (TEM) image of a unit dielectric layer ($BaTi_{0.4}Hf_{0.6}O_3$) of a thin film laminate structure according to some embodiments, which is arranged between a first electrode layer ($La_{0.04}Ba_{0.96}SnO_3$) and a second electrode layer ($La_{0.04}Ba_{0.96}SnO_3$)

FIG. 2 is a transmission electron microscope (TEM) image of a unit dielectric layer ($BaTi_{0.4}Hf_{0.6}O_3$) of a thin film laminate structure according to some embodiment, which is arranged between a first electrode layer ($La_{0.04}Ba_{0.96}SnO_3$) and a second electrode layer ($La_{0.04}Ba_{0.96}SnO_3$).

As shown in the image of FIG. 2, a unit dielectric layer ($BaTi_{0.4}Hf_{0.6}O_3$) is arranged between the first electrode layer ($La_{0.04}Ba_{0.96}SnO_3$) and the second electrode layer ($La_{0.04}Ba_{0.96}SnO_3$). The first electrode layer ($La_{0.04}Ba_{0.96}SnO_3$), the unit dielectric layer ($BaTi_{0.4}Hf_{0.6}O_3$), and the second electrode layer ($La_{0.04}Ba_{0.96}SnO_3$) have good lattice matching with each other. The good lattice matching may mitigate or prevent delamination between the first electrode layer ($La_{0.04}Ba_{0.96}SnO_3$), the unit dielectric layer ($BaTi_{0.4}Hf_{0.6}O_3$), or the second electrode layer ($La_{0.04}Ba_{0.96}SnO_3$). In some embodiments, the good lattice matching may help stabilize the O—B—O or O—B'—O bonds in the unit dielectric layer ($BaTi_{0.4}Hf_{0.6}O_3$).

Figure 3:
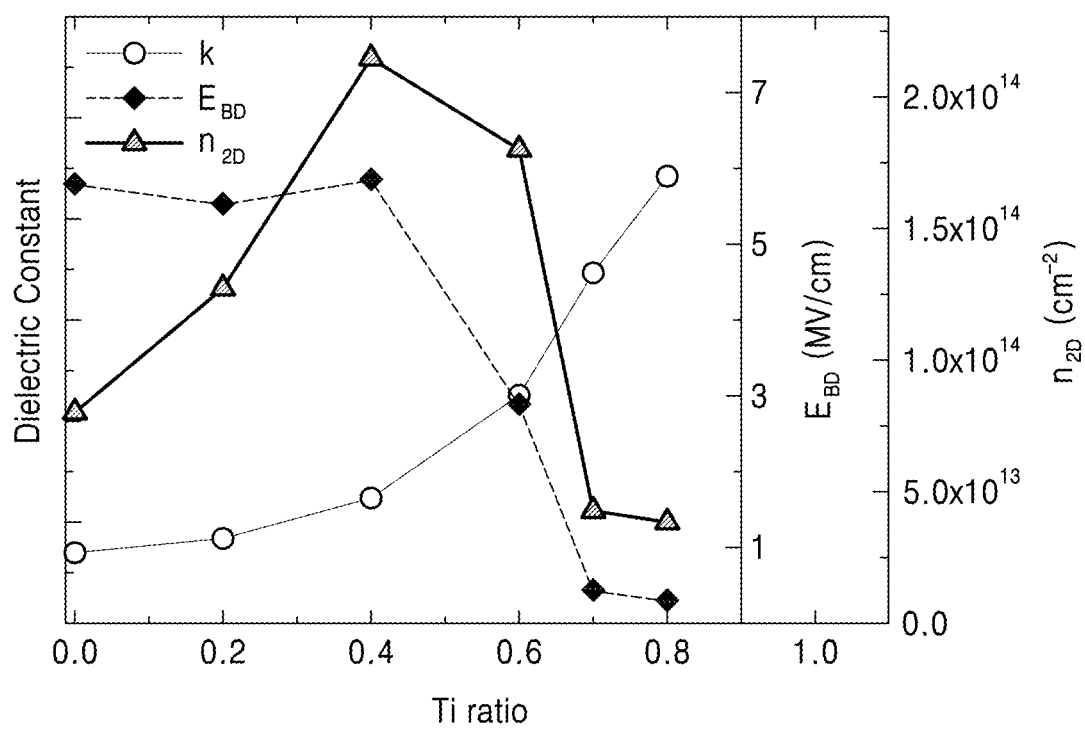
FIG. 3 is a graph of analysis of a dielectric constant, an insulation breakdown voltage $E_{BD}$ ($E_{Breakdown}$), and a 2D carrier density, according to Ti element concentration (1≤x≤0.8), in a unit dielectric layer ($BaTi_{1-x}Hf_xO_3$) of a thin film laminate structure according to some embodiments.

FIG. 3 is a graph of analysis of a dielectric constant, an insulation breakdown voltage ($E_{BD}$), and a 2D carrier density, according to Ti element concentration ($0\leq x\leq 0.8$), in the unit dielectric layer ($BaTi_{1-x}Hf_xO_3$) of the thin film laminate structure according to some embodiments.

Similar to the unit dielectric layer of a thin film laminate structure of FIG. 2, the unit dielectric layer ($BaTi_{1-x}Hf_xO_3$) of FIG. 3 is a unit dielectric layer arranged between the first electrode layer ($La_{0.04}Ba_{0.96}SnO_3$) and the second electrode layer ($La_{0.04}Ba_{0.96}SnO_3$). The unit dielectric layer ($BaTi_{1-x}Hf_xO_3$) has a monotonically increasing dielectric constant as Ti element concentration (1-x) increases from 0 atomic % to 80 atomic %. In the unit dielectric layer ($BaTi_{1-x}Hf_xO_3$), when the Ti element concentration (1-x) is increased from 0 atomic % to 40 atomic %, a 2D carrier density increased. When the Ti element concentration (1-x) exceeds 40 atomic %, the 2D carrier density decreased. In the unit dielectric layer ($BaTi_{1-x}Hf_xO_3$), when the Ti element concentration (1-x) is increased from 0 atomic % to 40 atomic %, the insulation breakdown voltage ($E_{BD}$) is maintained constant, and when the Ti element concentration (1-x) exceeds 40 atomic %, the insulation breakdown voltage ($E_{BD}$) is sharply reduced. As shown in the graph, the unit dielectric layer ($BaTi_{1-x}Hf_xO_3$) has a high dielectric constant and improved leakage current characteristics when the Ti element concentration (1-x) is 40 atomic % or less, and thus, in this respect, may be applied not only to a capacitor (metal-insulator-metal, MIM) for DRAM, but also to a memory device.

Figure 4:
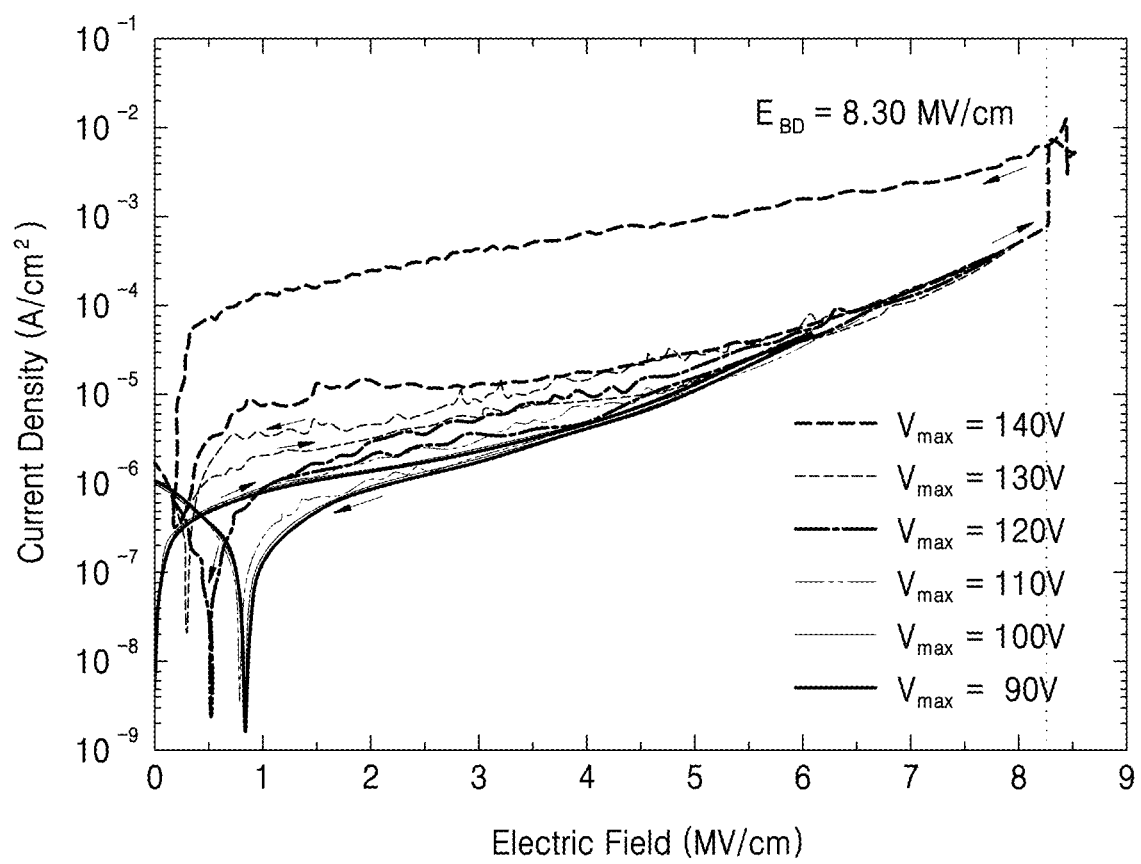
FIG. 4 is a graph of analysis of current density with respect to electric fields at different values of $V_{max}$ in a unit dielectric layer ($BaTi_{1-x}Hf_xO_3$) of a thin film laminate structure according to some embodiments, according to a Ti element concentration ((0≤x≤1) of the unit dielectric layer.

FIG. 4 is a graph of analysis of current density with respect to electric field at different values of $V_{max}$ in a unit dielectric layer ($BaTi_{1-x}Hf_xO_3$) of the thin film laminate according to some embodiments, according to a Ti element concentration ($0\leq x\leq 1$) of the unit dielectric layer.

Similar to the unit dielectric layer of a thin film laminate structure of FIG. 2, the unit dielectric layer ($BaTi_{1-x}Hf_xO_3$) of FIG. 4 is a unit dielectric layer arranged between the first electrode layer ($La_{0.04}Ba_{0.96}SnO_3$) and the second electrode layer ($La_{0.04}Ba_{0.96}SnO_3$). In the unit dielectric layer ($BaTi_{1-x}Hf_xO_3$), an insulation breakdown voltage $E_{BD}$ of the $Ba(Ti,Hf)O_3$ dielectric thin film having a Ti element concentration of 40 atomic % is shown. The amount of leakage current may be inferred from the magnitude of the insulation breakdown voltage $E_{BD}$. The unit dielectric layer ($BaTi_{1-x}Hf_xO_3$) has a leakage current of $10^{-7}$ A/cm or less when the Ti element concentration (1-x) is 40 atomic % or less, and thus, in this respect, may be applied not only to a capacitor (metal-insulator-metal, MIM) for DRAM, but also to a memory device.

Figure 5:
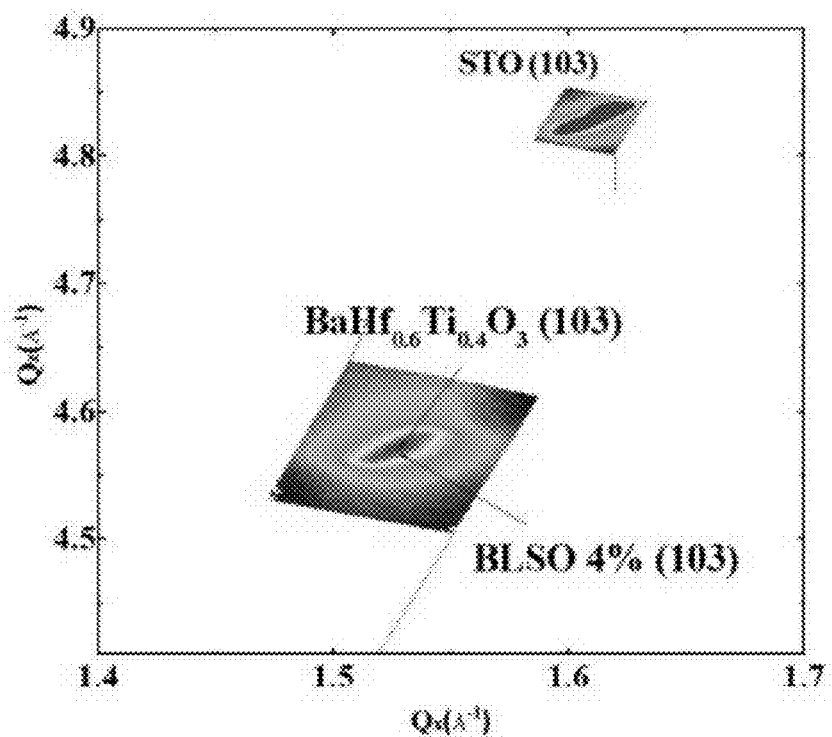
FIG. 5 represents results of reciprocal space mapping (RSM) showing lattice matching between a unit dielectric layer ($BaTi_{0.4}Hf_{0.6}O_3$(103)) and a first electrode layer ($La_{0.04}Ba_{0.96}SnO_3$(103)) in a thin film laminate structure according to an embodiment.

FIG. 5 represents results of reciprocal space mapping (RSM) showing lattice matching between a unit dielectric layer (BaTi$_{0.4}$Hf$_{0.6}$O$_3$(103)) and a first electrode layer (La$_{0.04}$Ba$_{0.96}$SnO$_3$(103)) in a thin film laminate structure according to some embodiments.

Referring to FIG. 5, in the thin film laminate structure according to an embodiment, there is exact lattice matching is shown between the unit dielectric layer (BaTi$_{0.4}$Hf$_{0.6}$O$_3$ (103)) and the first electrode layer (La$_{0.04}$Ba$_{0.96}$SnO$_3$(103)). In comparison, there is a lattice matching difference is shown between the unit dielectric layer (BaTi$_{0.4}$Hf$_{0.6}$O$_3$ (103)) and the substrate (SrTiO$_3$) under the unit dielectric layer.

Figure 6:
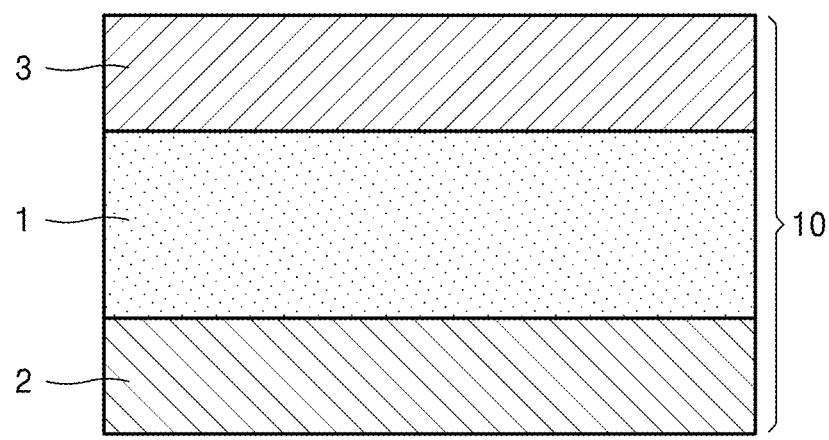
FIG. 6 is a cross-sectional schematic view of a thin film laminate structure according to some embodiments.
Figure 7:
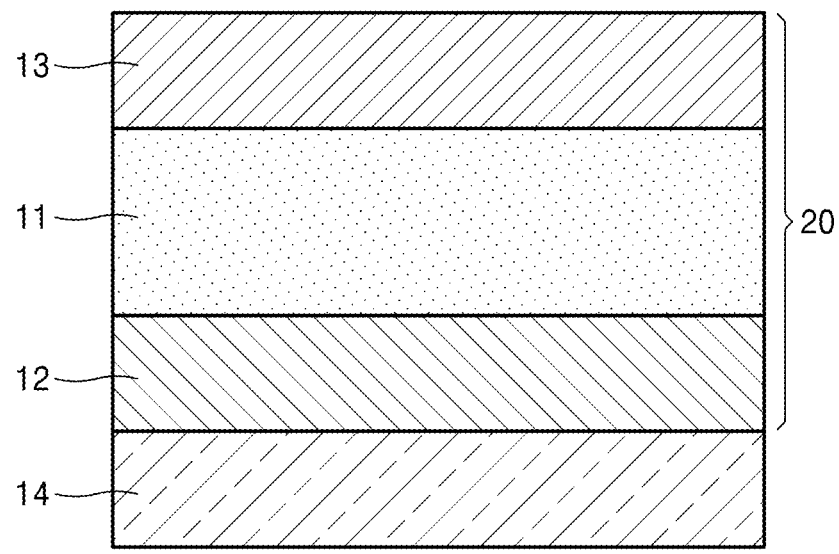
FIG. 7 is a cross-sectional schematic view of a thin film laminate structure according to some embodiments.

FIG. 6 is a cross-sectional schematic view of a thin film laminate structure according to an embodiment. FIG. 7 is a cross-sectional schematic view of a thin film laminate structure according to another embodiment.

As shown in FIG. 6, a thin film laminate structure 10 according to an embodiment may include: a first dielectric layer 1 comprising a compound represented by Formula 1, wherein x=0; and a second dielectric layer 2 and a third dielectric layer 3 respectively arranged on opposite surfaces of the first dielectric layer 1, wherein the second dielectric layer 2 and the third dielectric layer 3 may each independently include a compound represented by Formula 1, wherein 0<x<1.

For example, the first dielectric layer 1 may include a compound having a perovskite-type crystal structure and represented by ABO$_3$. In some embodiments, the first dielectric layer 1 may include at least one of BaTiO$_3$, SrTiO$_3$, CaTiO$_3$, BaHfO$_3$, BaZrO$_3$, SrHfO$_3$, SrZrO$_3$, CaHfO$_3$, or CaZrO$_3$. For example, the first dielectric layer 1 may include a compound selected from among BaTiO$_3$, SrTiO$_3$, CaTiO$_3$, BaHfO$_3$, BaZrO$_3$, or SrHfO$_3$; for example, a compound selected from BaTiO$_3$, SrTiO$_3$, or CaTiO$_3$; or, for example, BaTiO$_3$. The first dielectric layer 1 has high permittivity or ferroelectricity, and thus, a thin film laminate structure 10 including the same may have improved permittivity at 0° C. to 120° C., and even at room temperature.

In some embodiments, the second dielectric layer 2 and the third dielectric layer 3 may each independently include at least one of BaTi$_{1-z}$Hf$_z$O$_3$, BaTi$_{1-z}$Zr$_z$O$_3$, SrTi$_{1-z}$Hf$_z$O$_3$, SrTi$_{1-z}$Zr$_z$O$_3$, CaTi$_{1-z}$Hf$_z$O$_3$, or CaTi$_{1-z}$Zr$_z$O$_3$, wherein z may satisfy that 0<z<1. The second dielectric layer 2 and the third dielectric layer 3 may be, respectively, a dielectric layer that contacts a first electrode layer or second electrode layer in an electronic device. The second dielectric layer 2 and the third dielectric layer 3 may function as an interfacial layer between the first electrode layer or second electrode layer and the first dielectric layer 1. The second dielectric layer 2 and the third dielectric layer 3 may provide a difference in energy bandgap between the first electrode layer or second electrode layer and the interfacial layer as the B cation forms an alloy with the B' cation in the perovskite-type crystal structure. Thus, the thin film laminate structure 10 including the second dielectric layer 2 and the third dielectric layer 3 may have a leakage current improvement effect.

The second dielectric layer 2 and the third dielectric layer 3 may each have a thickness of 10% or less (e.g., on the basis of 100%) of the total thickness of the thin film laminate structure 10. For example, the second dielectric layer 2 and the third dielectric layer 3 may each have, on the basis of 100% of the total thickness of the thin film laminate structure 10, a thickness of 9% or less, or a thickness of 8% or less, or a thickness of 7% or less, or a thickness of 6% or less, or a thickness of 5% or less, or a thickness of 4% or less, or a thickness of 3% or less, or a thickness of 2% or less, or a thickness of 1% or less. The total thickness of the thin film laminate structure 10 is not limited. For example, when the thin film laminate structure 10 is applied to a capacitor (metal-insulator-metal, MIM) for DRAM, the total thickness of the thin film laminate structure 10 may be 10 nm to 15 nm. In some embodiments, the total thickness of the thin film laminate structure 10 may be measured as the distance from an upper surface of the third dielectric layer 3 to a lower surface of the second dielectric layer 2, or, when the thin film laminate structure 10 is applied to a capacitor, as a distance between opposing electrodes.

The first dielectric layer 1, the second dielectric layer 2, and the third dielectric layer 3 may each be a single layer or a multilayer of two or more layers.

A thin film laminate structure according to another embodiment (not illustrated) may include: a fourth dielectric layer; and fifth and sixth dielectric layers arranged on the opposite surfaces of the fourth dielectric layer, respectively, wherein the fourth dielectric layer, the fifth dielectric layer, and the sixth dielectric layer may each independently include a compound of the compound represented by Formula 1, wherein 0<x<1, and the concentration of B element or cation of the compound in the fourth dielectric layer may be higher than those in the fifth dielectric layer and the sixth dielectric layer. In some embodiments, the fourth, fifth, or sixth dielectric layers may be or include a region of thin film laminate structure. For example, in some embodiments, the concentration of B element or cation may gradually increase between the fourth and fifth dielectric layers, or gradually decrease between the fourth and sixth dielectric layers. In some embodiments, an interface between the fourth, fifth, or sixth dielectric layers may indistinct, but is not limited thereto.

The fourth dielectric layer, the fifth dielectric layer, and the sixth dielectric layer may include a compound having the same perovskite-type crystal structure and represented by Formula 1.

The compound may include a compound selected from among BaTi$_{1-z}$Hf$_z$O$_3$, BaTi$_{1-z}$Zr$_z$O$_3$, SrTi$_{1-z}$Hf$_z$O$_3$, SrTi$_{1-z}$Zr$_z$O$_3$, CaTi$_{1-z}$Hf$_z$O$_3$, or CaTi$_{1-z}$Zr$_z$O$_3$, wherein z may satisfy that 0<z<1.

The compound of the fourth dielectric layer may include a compound having a higher concentration of B element than those in the fifth dielectric layer and the sixth dielectric layer. A B/B' composition ratio, specifically, the concentration of B element, is increased in the compound of the fourth dielectric layer so that a ferroelectric-to-paraelectric transition temperature is increased. Thus, the thin film laminate structure having an improved permittivity at 0° C. to 120° C., and even at room temperature, like the first dielectric layer 1, may be provided.

The compound of the fifth dielectric layer or the sixth dielectric layer may include a compound having a higher concentration of B' element or cation than that of the fourth dielectric layer. Similar to the second dielectric layer 2 and the third dielectric layer 3, the fifth dielectric layer and the sixth dielectric layer may function as an interfacial layer between the first electrode layer or the second electrode layer and the fourth dielectric layer. By increasing the concentration of the B' cation in the perovskite-type crystal structure in the fifth dielectric layer and the six dielectric layer, an energy band gap between the first electrode layer or second electrode layer and the interfacial layer may be widened. Thus, the thin film laminate structure including the fifth dielectric layer and the sixth dielectric layer may have an improved leakage current.

In addition, the thin film laminate structure including the fifth dielectric layer and the sixth dielectric layer may improve leakage current, but may also contribute to leakage current improvement, due to strain relaxation occurring as a lattice constant between the fourth dielectric layer and the fifth dielectric layer and a lattice constant between the fourth dielectric layer and the sixth dielectric layer monolithically increase. This is, without being limited to a particular theory, attributed to a reduction in the density of line defects, such as threading dislocation, resulting from a difference in lattice constant between the first electrode layer and each dielectric layer with larger lattice mismatches.

The fifth dielectric layer and the sixth dielectric layer may each have a thickness of 10% or less of the total thickness of the thin film laminate structure. The fifth dielectric layer and the sixth dielectric layer may have a thickness that is the same as the thickness of the second dielectric layer 2 and the third dielectric layer 3 as described above, and thus a detailed description thereof will be omitted.

The fourth dielectric layer, the fifth dielectric layer, and the sixth dielectric layer may each have a single layer or a multilayer of two or more layers.

As shown in FIG. 7, a thin film laminate structure 30 according to an embodiment is a structure in which a thin film laminate structure 20(10) as described above is formed on a first electrode layer 14. The descriptions related with the composition and characteristics of the first electrode layer 14 are the same as those above, and thus, detailed descriptions thereof will be omitted.

Figure 8:
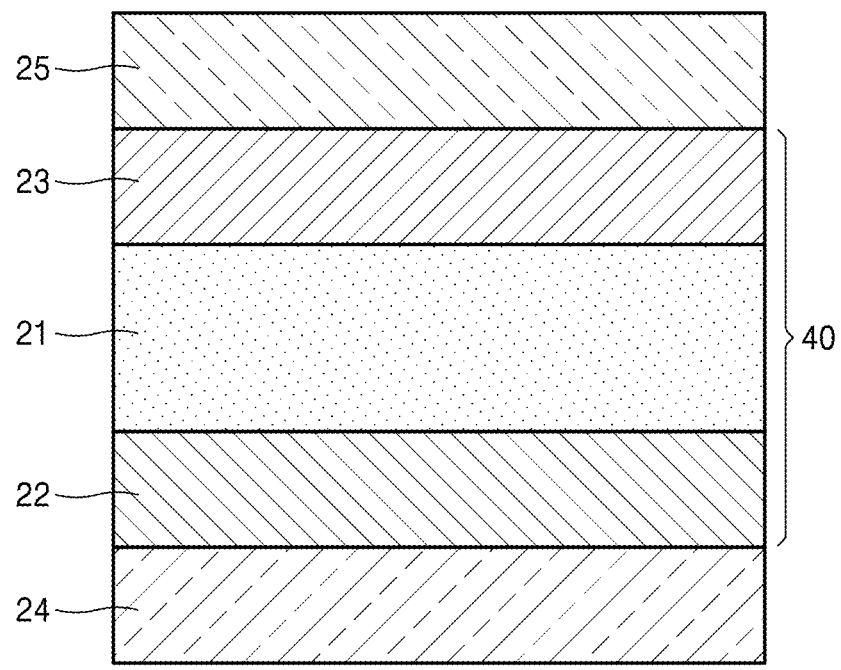
FIG. 8 is a schematic cross-sectional view of an integrated device (metal-insulator-metal) according to some embodiments.

FIG. 8 is a schematic cross-sectional view of an integrated device (metal-insulator-metal, MIM) according to an embodiment.

As shown in FIG. 8, an integrated device according to an embodiment may include: a thin film laminate structure 40; and a second electrode layer 25 arranged on the thin film laminate structure 40 opposite to a first electrode layer 24.

The second electrode layer 25 may include the same or different compound from a conductive compound of the first electrode layer 24.

For example, the second electrode layer 25 may include $La_xBa_{1-x}SnO_3$ (wherein $0<x'<1$).

The second electrode layer 25 may have a Ba/La composition ratio that is the same or different from that of the first electrode layer 24.

The integrated device may be or be included in a memory device or a logic device.

The integrated device may be or include a capacitor or a transistor. The integrated device may be a capacitor or transistor itself, and the capacitor or transistor may be implemented into a memory device to be included in a unit cell of a memory.

In the thin film laminate structure according to the embodiment, as in the above-described various embodiments, two or more dielectric layers having a controlled B/B' composition ratio in the perovskite-type crystal structure are arranged in a stack between the upper and lower electrode layers, thereby permittivity at 0° C. to 120° C., and even at room temperature, and causing strain relaxation to improve leakage current characteristics. Using the thin film laminate structure according to one or more embodiments manufactured to exhibit these characteristics, various integrated devices, including capacitors and rapidly accessible memory devices, for example, dynamic random access memory (DRAM) devices, variable resistance memory, ultrahigh-speed switches, or gate dielectric films of low-voltage transistors may be implemented. Using these integrated devices, capacitors having a metal-insulator-metal (MIM) structure, or transistors having a metal-oxide-semiconductor (MOS) structure may be implemented.

Figure 9:
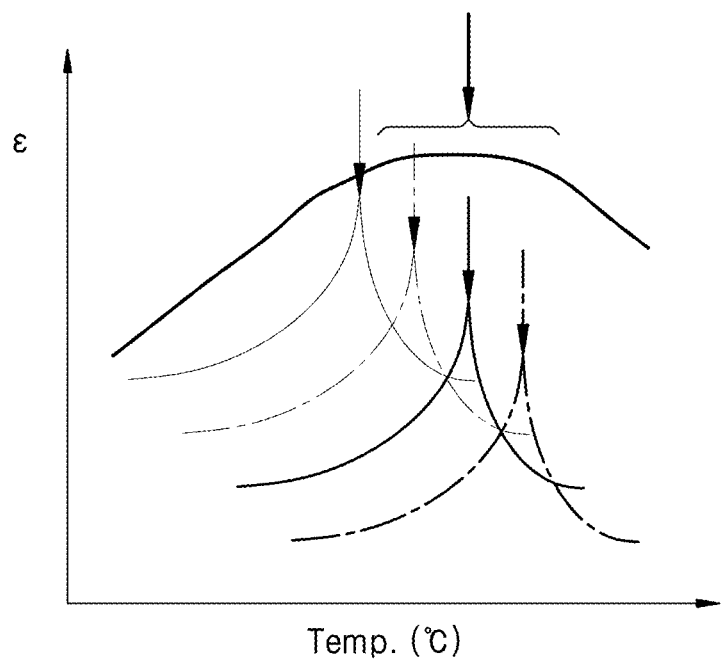
FIG. 9 is a schematic graph showing changes in ferro-electric-to-paraelectric phase transition temperature and dielectric constant according to an Hf/Ti composition ratio of a thin film laminate structure included in an integrated device according to some embodiments.

FIG. 9 is a schematic graph showing changes in ferroelectric-to-paraelectric phase transition temperature and dielectric constant according to an Hf/Ti composition ratio of a thin film laminate structure included in an integrated device according to an embodiment of FIG. 8.

Referring to FIG. 9, the higher the B' (e.g., Ti) concentration in the B/B' (e.g., Hf/Ti) composition ratio (e.g., the more a peak is to the right in the graph) of a thin film laminate structure included in an integrated device according to an embodiment, the ferroelectric-to-paraelectric phase transition temperature is increased. In addition, at the B/B' composition ratios of the thin film laminate structure indicated by arrows, permittivities are high. The thin film laminate structure manufactured on the basis of the correlation between phase transition temperature rise and B/B' composition ratio may exhibit a high permittivity at 0° C. to 120° C., and even at room temperature.

A method of manufacturing a thin film laminate structure according to an embodiment may include: preparing a substrate; and forming the thin film laminate structure 10 (20, 40) described above on the substrate.

The forming of the thin film laminate structure may use a physical vapor deposition (PVD) method, a chemical vapor deposition (CVD) method, a molecular beam epitaxy (MBE) method, an atomic layer deposition (ALD) method, or a pulsed laser deposition (PLD) method. However, embodiments are not limited thereto, and any deposition methods available in the art may be used.

Up to this point, examples embodiments have been described and illustrated in the drawings in order to help understanding of the present invention. However, it should be understood that these embodiments are only for illustrative and not for limiting the present invention. It should be understood that the present invention is not limited to the embodiments illustrated and described herein. It will be understood to those skilled in that art that various other modifications can be made within the scope of the invention.

As described above, a thin film laminate structure according to an aspect is a structure in which between a first electrode layer and a second electrode layer, two or more dielectric layers having a controlled B/B' composition ratio in the perovskite-type crystal structure of a compound represented by $AB_{1-x}B'_xO_3$ are arranged in a stack. The thin film laminate structure may have an increased permittivity at 0° C. to 120° C. and even at room temperature through control of a B/B' composition ratio, and enables strain relaxation to improve leakage current.

The thin film laminate structure as described above may be applied to an electronic device such as a capacitor, a memory device, or the like, and may also be applied to various integrated devices for an integrated circuit mounted on a substrate.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film laminate structure comprising:
a dielectric structure including
two or more dielectric layers each independently comprising a compound represented by Formula 1 and having a perovskite-type crystal structure; and
a middle dielectric layer, $$AB_{1-x}B'_xO_3 \quad \text{<Formula 1>}$$

wherein, in Formula 1,
A is a divalent (+2) cation,
B and B' are each independently a tetravalent (+4) cation, and
0≤x<1; and
wherein the middle dielectric layer is
electrically insulated by the two or more dielectric layers,
comprises A, O, and at least one of B and B',
has a perovskite-type crystal structure, and
has a B/B' composition ratio different from a B/B' composition ratio of each of the two or more dielectric layers.

2. The thin film laminate structure of claim 1, wherein O—B—O chemical bonds and O—B'—O chemical bonds in the perovskite-type crystal structure of the two or more dielectric layers have different bond strengths, and
the B/B' composition ratio affects permittivities of the middle dielectric layer.

3. The thin film laminate structure of claim 1, wherein the middle dielectric layer has increased permittivity at 0° C. to 120° C. due to an increase in a ferroelectric-to-paraelectric transition temperature in the perovskite-type crystal structure based on the B/B' composition ratio.

4. The thin film laminate structure of claim 1, wherein the compound represented by Formula 1 includes at least one of $BaTi_{1-z}Hf_zO_3$, $BaTi_{1-z}Zr_zO_3$, $SrTi_{1-z}Hf_zO_3$, $SrTi_{1-z}Zr_zO_3$, $CaTi_{1-z}Hf_zO_3$, or $CaTi_{1-z}Zr_zO_3$, wherein 0<z<1.

5. The thin film laminate structure of claim 1, wherein the middle dielectric layer comprises a compound represented by Formula 2:

$$A_{1-y}A'_yB_{1-x}B'_xO_3 \quad \text{<Formula 2>}$$

wherein, in Formula 2,
A' is a divalent (+2) ion, and
0<x<1, and 0<y<1.

6. The thin film laminate structure of claim 5, wherein the compound represented by Formula 2 comprises at least one of $Ba_{1-w}Ca_wTi_{1-z}Hf_zO_3$, $Ba_{1-w}Sr_wTi_{1-z}Hf_zO_3$, $Ba_{1-w}Ca_wTi_{1-z}Zr_zO_3$, $Ba_{1-w}Sr_wTi_{1-z}Zr_zO_3$, $Sr_{1-w}Ca_wTi_{1-z}Hf_zO_3$, or $Sr_{1-w}Ca_wTi_{1-z}Zr_zO_3$, wherein 0<z<1 and 0<w<1.

7. The thin film laminate structure of claim 1, further comprising:
a first electrode layer including a conductive compound having a perovskite-type crystal structure,
wherein the dielectric structure is on the first electrode layer.

8. The thin film laminate structure of claim 7, wherein the conductive compound is a transparent conductive oxide.

9. The thin film laminate structure of claim 7, wherein the conductive compound includes $La_{x'}Ba_{1-x'}SnO_3$, wherein 0<x'<1.

10. The thin film laminate structure of claim 9, wherein 0<x'≤0.07.

11. The thin film laminate structure of claim 7, wherein the first electrode layer has metallic or semi-conductive properties.

12. The thin film laminate structure of claim 1, wherein the middle dielectric layer comprises A, B, and O; and
wherein the two or more dielectric layers includes second and third dielectric layers on opposite sides of the middle dielectric layer, respectively,
wherein at least one of the second dielectric layer and the third dielectric layer comprise the compound represented by Formula 1, wherein 0<x<1.

13. The thin film laminate structure of claim 12, wherein the middle dielectric layer comprises at least one of $BaTiO_3$, $SrTiO_3$, $CaTiO_3$, $BaHfO_3$, $BaZrO_3$, $SrHfO_3$, $SrZrO_3$, $CaHfO_3$, or $CaZrO_3$.

14. The thin film laminate structure of claim 12, wherein the second dielectric layer and the third dielectric layer each independently comprise at least one of $BaTi_{1-z}Hf_zO_3$, $BaTi_{1-z}Zr_zO_3$, $SrTi_{1-z}Hf_zO_3$, $SrTi_{1-z}Zr_zO_3$, $CaTi_{1-z}Hf_zO_3$, or $CaTi_{1-z}Zr_zO_3$, wherein z satisfies that 0<z<1.

15. The thin film laminate structure of claim 12, wherein the second dielectric layer and the third dielectric layer each have a thickness of 10% or less of a total thickness of the dielectric structure.

16. The thin film laminate structure of claim 1, wherein the dielectric structure comprises:
a fourth dielectric layer; and
a fifth dielectric layer and a sixth dielectric layer on opposite surfaces of the [middle] dielectric layer, respectively,
the fourth dielectric layer, the fifth dielectric layer, and the sixth dielectric layer each independently comprise a compound of Formula 1, wherein 0<x<1, and
a concentration of the B cation in the middle dielectric layer is higher than a composition of the B cation in the fifth dielectric layer and a concentration of the B cation in the sixth dielectric layer.

17. The thin film laminate structure of claim 16, wherein, in the compound represented by Formula 1 in the middle dielectric layer, x is less than 0.6.

18. The thin film laminate structure of claim 16, wherein at least one of the compounds of the middle, fifth, or sixth dielectric layers comprise at least one of $BaTi_{1-z}Hf_zO_3$, $BaTi_{1-z}Zr_zO_3$, $SrTi_{1-z}Hf_zO_3$, $SrTi_{1-z}Zr_zO_3$, $CaTi_{1-z}Hf_zO_3$, or $CaTi_{1-z}Zr_zO_3$, wherein z satisfies that 0<z<1.

19. The thin film laminate structure of claim 16, wherein the fifth dielectric layer and the sixth dielectric layer each have a thickness of 10% or less of a total thickness of the dielectric structure.

20. An integrated device comprising:
the thin film laminate structure according to claim 1;
a first electrode layer on a first surface of the thin film laminate structure; and
a second electrode layer arranged on a second surface of the thin film laminate structure, the second surface of the thin film laminate structure opposite to the first surface of the thin film laminate structure.

21. The integrated device of claim 20, wherein
the second electrode layer includes a conductive compound, and
the conductive compound of the second electrode layer is the same as a conductive compound of the first electrode layer.

22. The integrated device of claim 20, wherein
the second electrode layer includes a conductive compound, and
the conductive compound of the second electrode layer is different from a conductive compound of the first electrode layer.

23. The integrated device of claim 20, wherein the second electrode layer comprises $La_{x'}Ba_{1-x'}SnO_3$ (wherein $0<x'<1$).

24. The integrated device of claim 22, wherein the second electrode layer has a Ba/La composition ratio that is the same as the first electrode layer.

25. The integrated device of claim 22, wherein the second electrode layer has a Ba/La composition ratio that is different from that of the first electrode layer.

26. The integrated device of claim 20, wherein the integrated device is a memory device or a logic device.

27. The integrated device of claim 20, wherein the integrated device comprises a capacitor or a transistor.

28. A method of manufacturing a thin film laminate structure, the method comprising:
    preparing a substrate; and
    forming, on the substrate, the thin film laminate structure according to claim 1.

29. The method of claim 28, wherein the forming of the thin film laminate structure comprises using a physical vapor deposition (PVD) method, a chemical vapor deposition (CVD) method, a molecular beam epitaxy (MBE) method, an atomic layer deposition (ALD) method, or a pulsed laser deposition (PLD) method.

\* \* \* \* \*